United States Patent [19]
Liu et al.

[11] Patent Number: 5,124,590
[45] Date of Patent: Jun. 23, 1992

[54] CMOS TRI-MODE INPUT BUFFER

[75] Inventors: Wen-Jung Liu, Sunnyvale; Ann K. Woo, Cupertino, both of Calif.

[73] Assignee: Advanced Micro Devices, Inc., Sunnyvale, Calif.

[21] Appl. No.: 743,945

[22] Filed: Aug. 12, 1991

[51] Int. Cl.⁵ .......................................... H03K 19/00
[52] U.S. Cl. .................................................. 307/473
[58] Field of Search ............... 307/443, 448, 451, 473, 307/475

[56] References Cited

U.S. PATENT DOCUMENTS

| | | | |
|---|---|---|---|
| 4,287,433 | 9/1981 | Goodspeed | 307/473 |
| 4,864,166 | 9/1989 | Gloaguen | 307/473 |
| 4,967,102 | 10/1990 | Mahler | 307/473 |
| 5,045,728 | 9/1991 | Crafts | 307/475 |

Primary Examiner—Robert J. Pascal
Attorney, Agent, or Firm—Davis Chin

[57] ABSTRACT

A CMOS tri-mode input buffer for generating three groups of binary codes at first and second output nodes in response to an input signal having three different voltage levels includes an output stage (20), first output buffer (22), a second output buffer (24), a first inptu circuit (26), and a second input circuit (28). The output stage (20) generates first and second output signals (Q1, Q2) at the respective first and second output noes (16, 18). The first output buffer is responsive to the first output signal (Q1) for generating a first buffered input signal (U1) which is CMOS logic compatible. The second output buffer (24) is responsive to the second output signal (Q2) for generating second buffered output signal (U2) which is CMOS logic compatible.

19 Claims, 2 Drawing Sheets

CMOS TRI-MODE INPUT BUFFER

DESCRIPTION

BACKGROUND OF THE INVENTION

This invention relates generally to digital logic circuitry and more particularly, to a CMOS tri-mode input buffer for generating three groups of binary codes in response to an input signal having three different input voltage levels.

As is generally well known in the prior art, tri-level buffer circuitry are typically used in connection with various test logic circuitry for testing a number of different functions within associated parent circuitry, such as on an integrated circuit microprocessor. In order to provide three different logical inputs into the integrated circuit device to be tested, there would be generally required two input test pins or pads. The advantage of tri-level buffers is that input test signals having three different voltage levels can be applied between the circuit ground reference and a single input test pin or pad, thereby saving use of an extra pin on the integrated circuit device.

In logic design, an input signal has commonly two possible logic states or levels. One state is defined as a high or logic "1" state and the second state is defined as a low or logic "0" state. In CMOS logic, the high state is represented by an upper supply potential VDD, which is typically at +5.0 volts, and the low state is represented by a lower supply potential VSS, which is typically at 0 volts. In the case of tri-level buffer circuitry, there is provided a third input state referred to as a "floating input" state wherein the input is left unconnected (open) or connected to a voltage level that is in between the low state and the high state (i.e., VDD/2).

SUMMARY OF THE INVENTION

Accordingly, it is a general object of the present invention to provide a CMOS tri-level input buffer which is relatively simple and economical to manufacture and assemble.

It is an object of the present invention to provide a CMOS tri-level input buffer for generating three groups of binary code in response to an input signal having three different voltage levels.

It is another object of the present invention to provide a CMOS tri-mode input buffer for generating three groups of binary codes which includes an output stage, a first output buffer, a second output buffer, a first input circuit, and a second input circuit.

In accordance with the preferred embodiment of the present invention, there is provided a CMOS tri-mode input buffer for generating three groups of binary codes at first and second output nodes in response to an input signal having three different voltage levels. The input buffer is formed of an output stage, a first output buffer, a second output buffer, a first input circuit, and a second input circuit. The output stage is formed of a first output transistor and a second output transistor. The first output transistor has its drain connected to an upper supply potential via a first load and its source connected to a lower supply potential. The second output transistor has its drain connected to the upper supply potential via a second load and its source connected to the lower supply potential. The first output transistor has its drain also connected to a first output node for generating a first output signal, and the second output transistor has its drain also connected to a second output node for generating a second output signal.

The first output buffer is formed of first and second inverters. The first inverter has its input connected to the first output node and its output connected to the input of the second inverter. The second inverter has an output for generating a first buffered output signal which is CMOS logic compatible. The second output buffer is formed of third, fourth and fifth inverters. The third inverter has its input connected to the second output node and its output connected to the input of the fourth inverter. The fifth inverter has its input connected to the output of the fourth inverter and its output for generating a second buffered output signal which is CMOS logic compatible.

The first input circuit is formed of a voltage divider and a first input transistor. The voltage divider is formed of first, second and third resistors. The first resistor has its one end connected to the upper supply potential and its other end connected to a first internal node and to an input pin for receiving the input signal. The second resistor has its one end connected to the first internal node and its other end connected to a second internal node and to the gate of the second output transistor. The third resistor has its one end connected to the second internal node and its other end connected to a third internal node. The first input transistor has its drain and gate connected together and to the third internal node. The source of the first input transistor is connected to the lower supply potential. The second input circuit is formed of second input transistor and a fourth resistor. The fourth resistor has its one end connected to the upper supply potential and its other end connected to a fourth internal node and to the gate of the first output transistor. The second input transistor has its drain connected to the fourth node, its gate connected to the third internal node, and its source connected to the lower supply potential.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
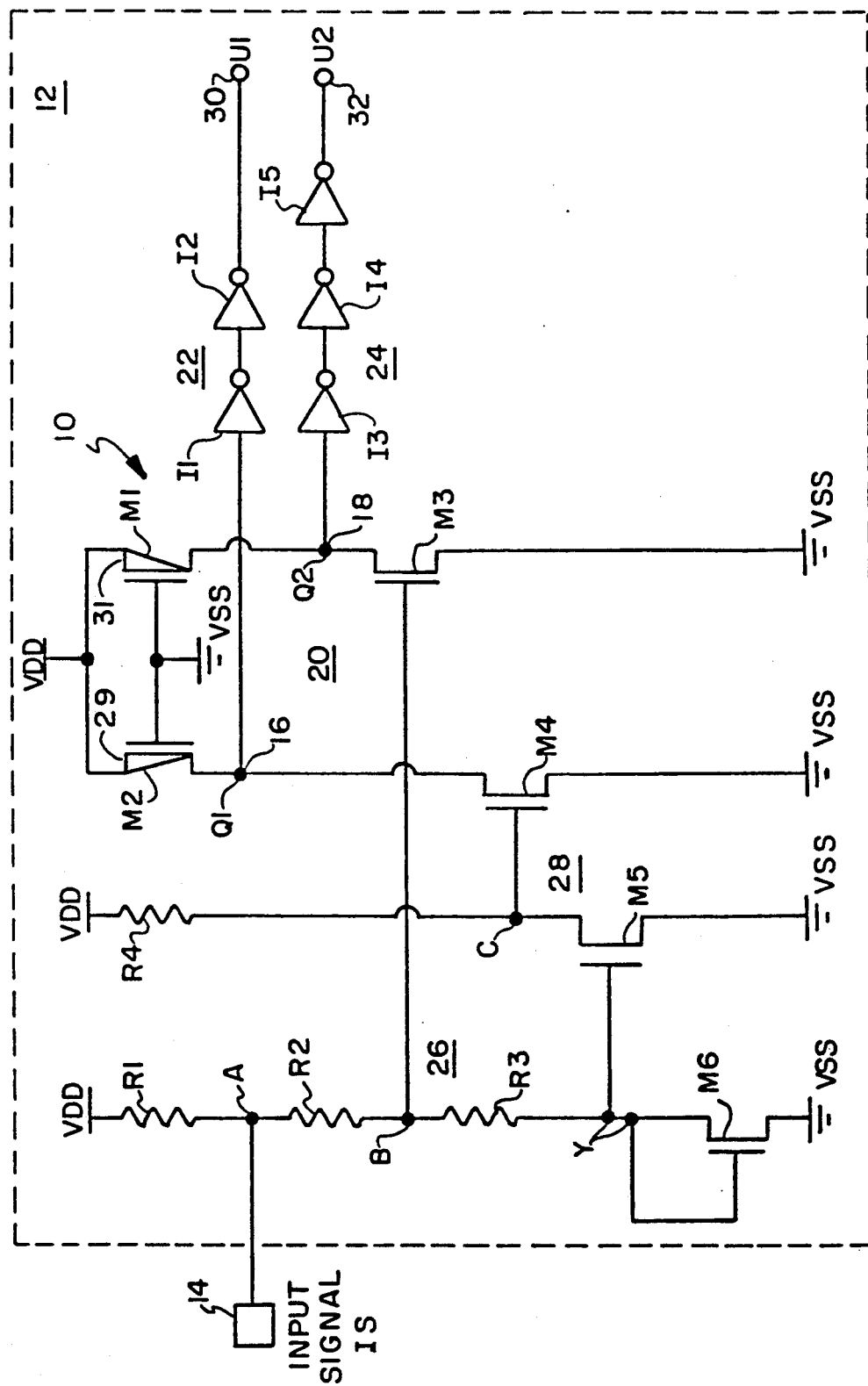
FIG. 1 is a schematic circuit diagram of a CMOS tri-mode input buffer, constructed in accordance with the principles of the present invention.

Referring now in detail to the drawings, there is shown in FIG. 1 a schematic circuit diagram of a CMOS tri-mode input buffer 10, constructed in accordance with the principles of the present invention. The input buffer 10 is formed as a part of a complex semiconductor integrated circuit chip 12 which has an input pad or pin 14 that is used for applying various input test signals to the integrated circuit. The input signal is received on the pin 14 has three different input voltage levels corresponding to three input logic states. A first input logic state consists of a low or logic "0" state. A second input logic state consists of a "floating input" state. Finally, a third input logic state consists of a high or logic "1" state. In CMOS logic circuitry, the input signal is in the low state when the input pin 14 is connected or tied to a lower supply potential VSS, which is typically at 0 volts. The input signal is in the high state when the input pin 14 is connected or tied to an upper supply potential VDD, which is typically at +5.0 volts. The input signal is in the "floating input" state when the input pin is left unconnected (open) or when it is connected to a voltage level that is half-way between the low state and the high state (i.e., VDD/2).

The CMOS tri-mode input buffer 10 has an input node A connected to the input pad or pin 14 for receiving the input signal IS having the three different logic states. In response to the input signal IS, the input buffer 10 generates three groups of binary codes defined by first and second output signal Q1, Q2 at respective first and second output nodes 16, 18.

The input buffer 10 includes an output stage 20, first output buffer stage 22, a second output buffer stage 24, a first input stage 26, and a second input stage 28. The output stage 20 includes first and second N-channel MOS output transistors M4, M3 and first and second loads 29, 31. The first output transistor M4 has its drain connected to the first output node 16, its gate connected to the output of the second input stage 28 at an internal node C and its source connected to a lower supply potential VSS. The lower supply potential is typically at 0 volts. The second output transistor M3 has its drain connected to the second output node 18, its gate connected to the first output of the first input stage 26 at an internal node B and its source connected to the lower supply potential.

The first load 29 is formed by a P-channel MOS transistor M2 which has its source connected to an upper supply potential VDD, its gate connected to the lower supply potential VSS, and its drain connected to the first output node 16. The upper supply potential VDD is typically at +5.0 volts. The second load 31 is formed by a P-channel MOS transistor M1 which has its source connected to the upper supply potential VDD, its gate connected to the lower supply potential VSS and its drain connected to the second output node 18.

Since the gates of the transistors M2 and M1 are connected to the lower supply potential, they are rendered always conductive so as to function as a resistive load. The first output node 16 provides the first output signal Q1. The second output node 18 provides the second output signal Q2. The first output buffer stage 22 is comprised of first and second inverters I1 and I2. The first inverter I1 has its input connected to the first output node 16 for receiving the first output signal Q1 and its output connected to the input of the second inverter I2. The output of the second inverter I2 is connected to a third output node 30 for generating a first buffered output signal U1. The second output buffer stage 24 is comprised of third, fourth and fifth inverters I3, I4 and I5. The third inverter I3 has its input connected to the second output node 18 for receiving the second output signal Q2 and its output connected to the input of the fourth inverter I4. The inverter I4 has its output connected to the input of the fifth inverter I5. The output of the fifth inverter I5 is connected to a fourth output node 32 for generating a second buffered output signal U2.

The first input stage 26 includes a voltage divider formed of resistors R1-R3 and a first N-channel MOS input transistor M6. The resistor R1 has its one end connected to the upper supply potential VDD and its other end connected to the input node A, which is coupled to the input pin 14 for receiving the input signal IS. The resistor R2 has its one end connected to the input node A and its other end connected to the internal node B. The resistor R3 has its one end connected to the internal node B and its other end connected to an internal node Y. The first input transistor M6 has its gate connected to its drain and to the internal node Y defining a second output of the first input stage. The source of the first input transistor M6 is connected to the lower supply potential VSS.

The second input stage 28 includes a second N-channel MOS input transistor M5 and a load resistor R4. The resistor R4 has its one end connected to the upper supply potential VDD and its other end connected to the internal node C. The second input transistor M5 has its drain connected to the internal node C defining the output of the second input stage, its gate connected to the second output of the first input stage at the internal node Y, and its source connected to the lower supply potential VSS.

Figure 2:
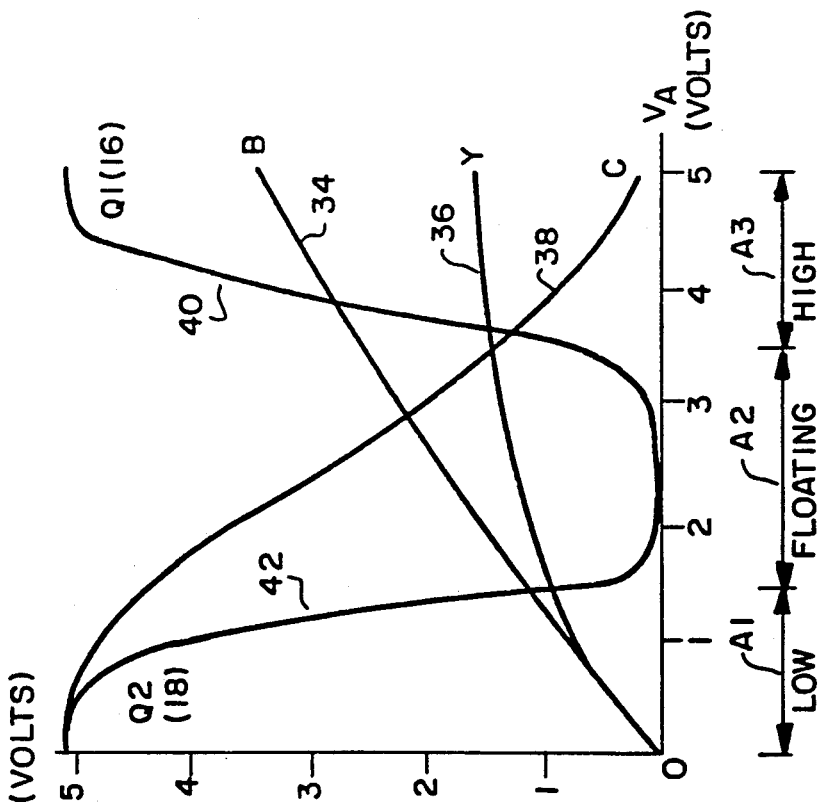
FIG. 2 is a plot of various points in the circuit of FIG. 1, which is useful in understanding the operation thereof.

The operation of the input buffer 10 will now be described with reference to the waveforms of FIG. 2. FIG. 2 illustrates the response characteristics at respective nodes B (curve 34), Y (curve 36), C (curve 38), 16 (curve 40) and 18 (curve 42) when the input voltage $V_A$ at the node A is swept or varied between 0 to +5.0 volts. When the input voltage $V_A$ is at the low logic state (low input region A1), the voltage level at the first output of the first input stage 26 at node B (curve 34) will also be at 0 volts. As a result, the second output transistor M3 will be rendered non-conductive and the voltage level of the output signal Q2 at the second output node 18 (curve 42) will be at the high or "1" logic state.

Figure 4:
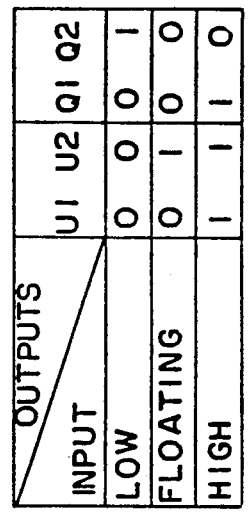
FIG. 4 depicts a truth table of the input and output levels for the input buffer of FIG. 1.

The actual voltage level at the node 18 will be at approximately the upper supply potential VDD or +5.0 volts. Further, the voltage level at the second output node Y (curve 36) of the first input stage 26 will likewise be at 0 volts, thereby turning off the transistors M6 and M5. Since the transistor M5 is rendered non-conductive, the voltage level at the node C (curve 38) will be at the upper supply potential VDD. Consequently, this causes the first output transistor M4 to be turned on, thereby pulling the voltage level of the first output signal Q1 at the first output node 16 (curve 40) to a low or logic "0" state. Therefore, with a low input voltage ($V_A$ in the low state) the first output signal Q1 is at the logic "0" state and the second output signal Q2 is at the logic "1" state, as shown in the truth table of FIG. 4.

When the input voltage $V_A$ is increased so that the voltage at the node B is raised above the threshold voltage $V_{tn}$ of the transistor M3 (floating input region A2), the second output transistor M3 will be turned on and the voltage level of the second output signal Q2 (curve 42) will go to a logic "0" state. Further, as the voltage at the node Y reaches the threshold voltage $V_{tn}$ of the transistors M5 and M6, they will both be turned on. Since the gate and drain of the first input transistor M6 are tied together, the transistor M6 will be operated immediately in the saturation region so that the voltage at the second output node Y will increase very slowly with respect to the increasing current flowing through its conduction path due to the increased input voltage $V_A$. This slowly increasing voltage at the output node Y (curve 36) will maintain the voltage level at the internal node C in the high state, thereby keeping the first output transistor M4 in the conductive state and the first output signal Q1 in the logic "0" state. Therefore, with a "floating input" voltage ($V_A$ in the floating state) both the first and second output signals Q1 and Q2 are at the logic "0" states, as shown in the truth table of FIG. 4.

When the input voltage $V_A$ is further increased, the voltage level at the node Y will continue to increase and the voltage level at the node C will continue to decrease. Eventually, the voltage level at the node C (curve 38) will drop below the threshold voltage $V_{tn}$ of the first output transistor M4 (high input region A3), thereby turning off the same. As a result, the voltage of the first output signal Q1 will go to a logic "1" state. Therefore, it can be seen that with the high input voltage ($V_A$ in the high logic state), the first output signal Q1 is at the logic "1" state and the second output signal Q2 is at the logic "0" state, as shown in the truth table of FIG. 4.

In order to provide a full CMOS voltage swing (i.e., 0 to +5.0 volts), the first output signal Q1 is buffered through the inverters I1 and I2 to generate the first buffered output signal U1 which is CMOS compatible and has a high drive capability. It will be noted that the first buffered output signal U1 has the same logic state as the first output signal Q1. Similarly, the second output signal Q2 is buffered through the inverters I3, I4 and I5 to generate the second buffered output signal U2 which is CMOS compatible and has a high drive capability. It will also be noted that the second buffered output signal U2 has a logic state which is inverted from the second output signal Q2. The logic states for the buffered output signals U1 and U2 are also illustrated in the truth table of FIG. 4.

Figure 3:
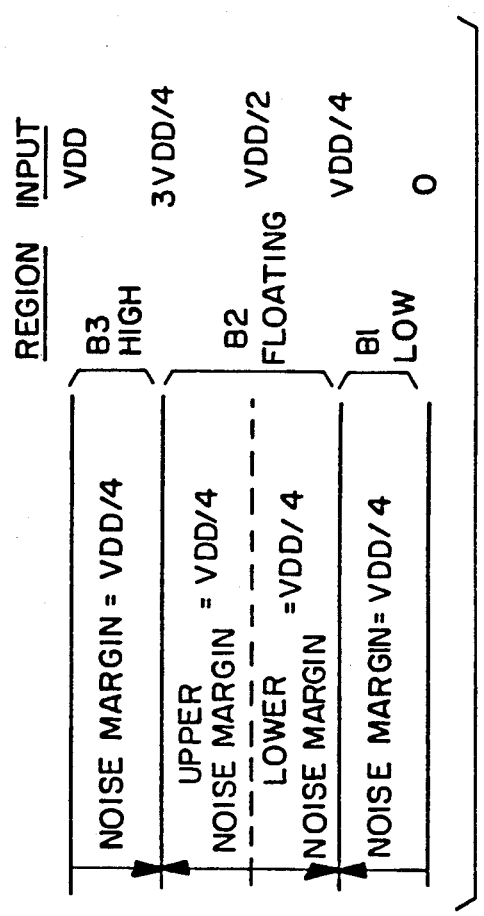
FIG. 3 is a diagram illustrating the noise margins for each of the three different regions of the input voltage levels.

Ideally, it would be desired to have the same noise margin for each of the three different input logic states. For example, there is illustrated in FIG. 3 how the input logic states have been divided into three regions. The low logic region (B1) corresponds to when the input signal IS is varied between 0 to VDD/4. The floating region (B2) corresponds to when the input signal IS is varied between VDD/4 to 3VDD/4. The high logic region (B3) corresponds to when the input signal is varied between 3VDD/4 to VDD. In this manner, there is provided an optimized noise margin of VCC/4 for each of the three regions. This is achieved by appropriately selecting the value of resistors R1-R3. Further, the value of the resistors R1-R3 are selected so that the input voltage $V_A$ will be approximately equal to VDD/2 when the input pin 14 is left unconnected.

While a specific embodiment of the invention has been illustrated and described herein, it should be realized that numerous modifications and changes will occur to those skilled in the art. For example, it will be appreciated that the P-channel MOS transistors can all be changed to N-channel MOS transistors, and vice-versa, and the polarities of the power supply voltages can be reversed.

From the foregoing detailed description, it can thus be seen that the present invention provides a CMOS trimode input buffer for generating three groups of binary codes at first and second output nodes in response to an input signal having three different voltage levels. The input buffer of the present invention is formed of an output buffer stage, a first output buffer, a second output buffer, a first input circuit, and a second input circuit.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A CMOS tri-mode input buffer for generating three groups of binary codes at first and second output nodes in response to an input signal having three different voltage levels, said input buffer comprising:

an output stage (20) formed of a first output transistor (M4) and a second output transistor (M3), said first output transistor (M4) having its drain connected to an upper supply potential (VDD) via a first load (29) and its source connected to a lower supply potential (VSS), said second output transistor (M3) having its drain connected to the upper supply potential (VDD) via a second load (31) and its source connected to the lower supply potential (VSS);

said first output transistor (M4) having its drain also connected to a first output node (16) for generating a first output signal (Q1), said second output transistor having its drain also connected to a second output node (18) for generating a second output signal (Q2);

a first output buffer (22) formed of first and second inverters (I1, I2), said first inverter (I1) having its input connected to said first output node (16) and its output connected to the input of said second inverter (I2), said second inverter (I2) having an output for generating a first buffered output signal (U1) which is CMOS logic compatible;

a second output buffer (24) formed of third, fourth and fifth inverters (I3, I4, I5), said third inverter having its input connected to said second output node (18) and its output connected to the input of said fourth inverter (I4), said fifth inverter (I5) having its input connected to the output of said fourth inverter (I4) and an output for generating a second buffered output signal (U2) which is CMOS logic compatible;

first input circuit means (26) formed of a voltage divider and a first input transistor (M6), said voltage divider being formed of first, second and third resistors (R1-R3), said first resistor (R1) having its one end connected to the upper supply potential (VDD) and its other end connected to a first internal node (A) and to an input pin (14) for receiving the input signal, said second resistor (R2) having its one end connected to the first internal node (A) and its other end connected to a second internal node (B) and to the gate of said second output transistor (M3), said third resistor (R3) having its one end connected to the second internal node (B) and its other end connected to a third internal node (Y), said first input transistor (M6) having its drain and gate connected together and to the third internal node (Y), the source of said first input transistor (M6) being connected to the lower supply potential (VSS); and second input circuit means (28) formed of a second input transistor (M5) and a fourth resistor (R4), said fourth resistor (R4) having its one end connected to the upper supply potential (VDD) and its other end connected to a fourth internal node (C) and to the gate of said first output transistor (M4), said second input transistor (M5) having its drain connected to the fourth internal node (C), its gate connected to the third internal node (Y), and its source connected to the lower supply potential (VSS).

2. A CMOS tri-mode input buffer as claimed in claim 1, wherein said first load (29) is comprised of a first P-channel MOS transistor (M2) having its source connected to the upper supply potential (VDD), its gate connected to the lower supply potential (VSS), and its drain connected to the first output node (16).

3. A CMOS tri-mode input buffer as claimed in claim 2, wherein said second load (31) is comprised of a second P-channel MOS transistor (M1) having its source connected to the upper supply potential (VDD), its gate connected to the lower supply potential (VSS) and its drain connected to the second output node (18).

4. A CMOS tri-mode input buffer as claimed in claim 1, wherein said upper supply potential (VDD) is at +5.0 volts, and wherein said lower supply potential (VSS) is at 0 volts.

5. A CMOS tri-mode input buffer as claimed in claim 1, wherein said first and second output transistors (M4, M3) are N-channel MOS transistors.

6. A CMOS tri-mode input buffer as claimed in claim 1, wherein said first input transistor (M6) is an N-channel MOS transistor.

7. A CMOS tri-mode input buffer as claimed in claim 1, wherein said second input transistor (M5) is an N-channel MOS transistor.

8. A CMOS tri-mode input buffer as claimed in claim 1, wherein said input signal in a low logic region defining a first input voltage level when it is varied between 0 to VDD/4, said input signal is in a floating region defining a second input voltage level when it is varied between VDD/4 to 3VDD/4, and said input signal is in a high logic region defining a third input voltage level when it is varied between 3VDD/4 to VDD.

9. A CMOS tri-mode input buffer as claimed in claim 1, wherein the value of said resistors (R1-R3) are selected so that the voltage level is at approximately VDD/2 when said input pin (14) is left unconnected.

10. A tri-mode input buffer for generating three groups of binary codes at first and second output nodes in response to an input signal having three different voltage levels, said input buffer comprising:

an output stage (20) formed of a first output transistor (M4) and a second output transistor (M3), said first output transistor (M4) having its drain connected to an upper supply potential (VDD) via a first load (29) and its source connected to a lower supply potential (VSS), said second output transistor (M3) having its drain connected to the upper supply potential (VDD) via a second load (31) and its source connected to the lower supply potential (VSS);

said first output transistor (M4) having its drain also connected to a first output node (16) for generating a first output signal (Q1), said second output transistor having its drain also connected to a second output node (18) for generating a second output signal (Q2);

first input circuit means (26) formed of a voltage divider and a first input transistor (M6), said voltage divider being formed of first, second and third resistors (R1-R3), said first resistor (R1) having its one end connected to the upper supply potential (VDD) and its other end connected to a first internal node (A) and to an input pin (14) for receiving the input signal, said second resistor (R2) having its one end connected to the first internal node (A) and its other end connected to a second internal node (B) and to the gate of said second output transistor (M3), said third resistor (R3) having its one end connected to the second internal node (B) and its other end connected to a third internal node (Y), said first input transistor (M6) having its drain and gate connected together and to the third internal node (Y), the source of said first input transistor (M6) being connected to the lower supply potential (VSS); and second input circuit means (28) formed of a second input transistor (M5) and a fourth resistor (R4), said fourth resistor (R4) having its one end connected to the upper supply potential (VDD) and its other end connected to a fourth internal node (C) and to the gate of said first output transistor (M4), said second input transistor (M5) having its drain connected to the fourth internal node (C), its gate connected to the third internal node (Y), and its source connected to the lower supply potential (VSS).

11. A tri-mode input buffer as claimed in claim 10, wherein said first load (29) is comprised of a first P-channel MOS transistor (M2) having its source connected to the upper supply potential (VDD), its gate connected to the lower supply potential (VSS), and its drain connected to the first output node (16).

12. A tri-mode input buffer as claimed in claim 11, wherein said second load (31) is comprised of a second P-channel MOS transistor (M1) having its source connected to the upper supply potential (VDD), its gate connected to the lower supply potential (VSS) and its drain connected to the second output node (18).

13. A tri-mode input buffer as claimed in claim 10, wherein said upper supply potential (VDD) is at +5.0 volts, and wherein said lower supply potential (VSS) is at 0 volts.

14. A tri-mode input buffer as claimed in claim 10, wherein said first and second output transistors (M4, M3) are N-channel MOS transistors.

15. A tri-mode input buffer as claimed in claim 10, wherein said first input transistor (M6) is an N-channel MOS transistor.

16. A tri-mode input buffer as claimed in claim 10, wherein said second input transistor (M5) is an N-channel MOS transistor.

17. A tri-mode input buffer as claimed in claim 10, wherein said input signal in a low logic region defining a first input voltage level when it is varied between 0 to VDD/4, said input signal is in a floating region defining a second input voltage level when it is varied between VDD/4 to 3VDD/4, and said input signal is in a high logic region defining a third input voltage level when it is varied between 3VDD/4 to VDD.

18. A tri-mode input buffer as claimed in claim 10, wherein the value of said resistors (R1-R3) are selected so that the voltage level is at approximately VDD/2 when said input pin (14) is left unconnected.

19. A tri-mode input buffer for generating three groups of binary codes at first and second output nodes in response to an input signal having three different voltage levels, said input buffer comprising:

an output stage (20) formed of a first output transistor (M4) and a second output transistor (M3), said first output transistor (M4) having its drain connected to an upper supply potential (VDD) via a first load (29) and its source connected to a lower supply potential (VSS), said second output transistor (M3) having its drain connected to the upper supply potential (VDD) via a second load (31) and its source connected to the lower supply potential (VSS);

said first output transistor (M4) having its drain also connected to a first output node (16) for generating a first output signal (Q1), said second output transistor having its drain also connected to a second output node (18) for generating a second output signal (Q2);

first input means responsive to an input signal for establishing first and second control voltages at respective first and second internal nodes;

second input means responsive to said second control voltage at said second internal node for generating a third control signal at a third internal node; and the gate of said first output transistor (M4) being responsive to said third control voltage and the gate of said second output transistor (M3) being responsive to said first control voltage.

* * * * *

UNITED STATES PATENT AND TRADEMARK OFFICE
CERTIFICATE OF CORRECTION

PATENT NO. : 5,124,590

DATED : June 23, 1992

INVENTOR(S) : Wen-Jung Liu et al.

It is certified that error appears in the above-identified patent and that said Letters Patent is hereby corrected as shown below:

On the Title page, in the Abstract, line 5, change "inptu" to --input--.

On the Title page, in the Abstract, line 8, change "noes" to --nodes--.

Column 2, line 68, change "is" to --IS--.

Signed and Sealed this

Third Day of August, 1993

Attest:

MICHAEL K. KIRK

Attesting Officer        Acting Commissioner of Patents and Trademarks